(12) United States Patent
Nakayama

(10) Patent No.: US 7,682,137 B2
(45) Date of Patent: Mar. 23, 2010

(54) JET GENERATING DEVICE AND ELECTRONIC APPARATUS

(75) Inventor: Norikazu Nakayama, Saitama (JP)

(73) Assignee: Sony Corporation, Tokyo (JP)

( * ) Notice: Subject to any disclaimer, the term of this patent is extended or adjusted under 35 U.S.C. 154(b) by 695 days.

(21) Appl. No.: 11/379,498

(22) Filed: Apr. 20, 2006

(65) Prior Publication Data

US 2006/0239844 A1 Oct. 26, 2006

(30) Foreign Application Priority Data

Apr. 21, 2005 (JP) ............................ P2005-123656

(51) Int. Cl.
*F04B 17/00* (2006.01)
*H05K 7/20* (2006.01)
*H01L 41/00* (2006.01)

(52) U.S. Cl. ..................... 417/413.1; 361/695; 310/317
(58) Field of Classification Search ................. 391/694, 391/695, 697; 310/317, 316.01, 316.02, 310/316.03, 324, 344; 417/307, 413.1–413.2, 417/412

See application file for complete search history.

(56) References Cited

U.S. PATENT DOCUMENTS

| | | | |
|---|---|---|---|
| 3,373,752 A | | 3/1968 | Inoue |
| 4,350,838 A | | 9/1982 | Harrold |
| 5,725,363 A | * | 3/1998 | Bustgens et al. .......... 417/413.1 |
| 5,759,014 A | * | 6/1998 | Van Lintel ............... 417/413.3 |
| 5,861,703 A | * | 1/1999 | Losinski ..................... 310/330 |
| 6,004,115 A | * | 12/1999 | da Costa ................. 417/413.2 |
| 6,104,127 A | * | 8/2000 | Kameyama et al. ......... 310/346 |
| 6,123,145 A | * | 9/2000 | Glezer et al. ........... 165/104.33 |
| 6,197,255 B1 | * | 3/2001 | Miyake et al. ................ 422/64 |
| 6,232,680 B1 | * | 5/2001 | Bae et al. ...................... 310/17 |
| 6,361,294 B1 | * | 3/2002 | Witzigreuter et al. ..... 417/413.3 |
| 6,364,637 B1 | * | 4/2002 | Hase et al. ............... 417/413.1 |
| 6,367,470 B1 | | 4/2002 | Denyer et al. |
| 6,488,641 B2 | * | 12/2002 | Hansen ........................ 601/149 |
| 6,588,497 B1 | | 7/2003 | Glezer et al. |
| 6,765,325 B1 | * | 7/2004 | Prouvost ....................... 310/87 |
| 7,011,507 B2 | * | 3/2006 | Seto et al. .................... 417/412 |

(Continued)

FOREIGN PATENT DOCUMENTS

JP          02-213200          8/1990

(Continued)

OTHER PUBLICATIONS

European Search Report dated Aug. 4, 2006.

(Continued)

*Primary Examiner*—Charles G Freay
(74) *Attorney, Agent, or Firm*—Sonnenschein Nath & Rosenthal LLP

(57) ABSTRACT

A jet generating device includes a housing having an opening and containing gas therein, a vibrating member which is supported by the housing so that the vibrating member is capable of vibrating and which vibrates the gas to discharge the gas as pulsating gas through the opening, a driving mechanism for driving the vibrating member in accordance with an electrical signal, and a drive controller which generates the electrical signal at a fundamental frequency at which an input impedance of the driving mechanism is substantially a maximum and which outputs the generated electrical signal to the driving mechanism.

7 Claims, 10 Drawing Sheets

U.S. PATENT DOCUMENTS

| | | | |
|---|---|---|---|
| 7,198,250 B2 * | 4/2007 | East | 251/129.06 |
| 7,284,966 B2 * | 10/2007 | Xu et al. | 417/395 |
| 7,290,993 B2 * | 11/2007 | Vogeley et al. | 417/413.2 |
| 2002/0112497 A1 | 8/2002 | Patel | |
| 2002/0155010 A1 * | 10/2002 | Karp et al. | 417/413.2 |
| 2004/0000843 A1 * | 1/2004 | East | 310/331 |
| 2004/0021398 A1 * | 2/2004 | East | 310/311 |
| 2005/0056030 A1 | 3/2005 | Bash et al. | |
| 2005/0089415 A1 * | 4/2005 | Cho et al. | 417/413.2 |
| 2007/0217929 A1 * | 9/2007 | Chiou | 417/412 |

FOREIGN PATENT DOCUMENTS

| | | |
|---|---|---|
| JP | 03-116961 | 5/1991 |
| WO | WO 2005/008348 | 1/2005 |

OTHER PUBLICATIONS

European Search Report dated Nov. 15, 2007.

* cited by examiner

JET GENERATING DEVICE AND ELECTRONIC APPARATUS

CROSS REFERENCES TO RELATED APPLICATIONS

The present invention contains subject matter related to Japanese Patent Application JP 2005-123656 filed in the Japanese Patent Office on Apr. 21, 2005, the entire contents of which are incorporated herein by reference.

BACKGROUND OF THE INVENTION

1. Field of the Invention

The present invention relates to a vibrator for vibrating gas for generating a jet of the gas, a jet generating device including the vibrator, and an electronic apparatus including the jet generating device.

2. Description of the Related Art

An increase in the scale and speed of large scale integrated circuits (LSI circuits) in recent years have caused electrical power consumption of the LSI circuits to increase year after year. Since most of the electrical power consumed by the LSI circuits is converted into heat energy, the increase in electrical power consumption has led to an increase in the heat value of the LSI circuits. With regard to a system using such an LSI circuit having high electrical power consumption, effort is being made to increase performance of a heat-dissipating system so that the temperature of the LSI circuit does not exceed its maximum operating temperature.

The most general index indicating the performance of a heat-dissipating system is heat resistance. When the temperature of a heat source whose heat value is P[W] is T (° C. or K) as a result of being cooled by a certain heat-dissipating system, a heat resistance Rth[K/W] of the heat-dissipating system is expressed by the following formula:

$$Rth=(T-Ta)/P$$

Here, Ta is ambient temperature (outside air temperature) when is an air-cooling system is used. In order not to increase the temperature of the heat source even if the heat value is high, the heat resistance of the heat-dissipating system is made small. In other words, a heat-dissipating system providing good performance is one having a small heat resistance. For example, in order for a maximum heat value to maintain the temperature of a 20[W] LSI circuit equal to or less than 70° C., under an environment in which the outside air temperature has a maximum value of 40° C., a heat-dissipating system having a heat resistance of less than 1.5 [K/W] is used. When the heat value of the LSI circuit is increased to 100 [W], a typical heat resistance is less than 0.3 [K/W].

A heat-dissipating system which makes use of forceful air cooling basically includes a heat exchanger exchanging heat between a heat source and outside air and an air blower which sends the outside air to the heat exchanger. The heat resistance of this heat-dissipating system may be reduced by increasing efficiency of the heat exchanger or by increasing an air discharge amount of the air blower. For example, by putting thought in the material and structure of a radiating fin or by increasing the surface area of the radiating fin, the efficiency of the heat exchange can be increased. In a system using an axial fan which rotates as the air blower, the air discharge amount can be increased by, for example, increasing the rotational speed or diameter of the fan.

However, in forceful convection of air with such a fan, a temperature boundary layer at a surface of the fin is produced at a downstream side of the fin, thereby giving rise to the problem that heat from the radiating fin is not efficiently removed. This problem may be solved by, for example, reducing the thickness of the temperature boundary layer as a result of increasing fan air velocity. However, increasing the rotational speed of the fan for the purpose of increasing the fan air velocity causes noise to be generated, such as noise from a fan bearing or noise of the wind produced by the fan.

Methods using a vibrating plate that reciprocates periodically (refer to, for example, Japanese Unexamined Patent Application Publication Nos. 2000-223871 (FIG. 2), 2000-114760 (FIG. 1), 2-213200 (FIG. 1), and 3-116961 (FIGS. 3 and 11)) are available as methods which efficiently allow heat from a radiating fin to escape to outside air by destroying the temperature boundary layer without using a fan as an air blower. Of devices in these four documents, in particular, the devices in Japanese Unexamined Patent Application Publication Nos. 2-213200 and 3-116961 include a vibrating plate which roughly divides space in a chamber in two, a resilient member disposed in the chamber and supporting the vibrating plate, and a unit which vibrates the vibrating plate. In these devices, for example, when the vibrating plate is displaced upwards, the volume of an upper space of the chamber is reduced. Therefore, the pressure in the upper space is increased. Since the upper space is connected to the outside air through a suction-exhaust opening, a portion of the air in the upper space is discharged to the outside air by the pressure increase in the upper space. At this time, the volume of a lower space that is opposite to the upper space (the vibrating plate is disposed between the lower space and the upper space) is increased, causing the pressure in the lower space to decrease. Since the lower space is connected to the outside air through a suction-exhaust opening, the pressure reduction in the lower space causes a portion of the outside air existing near the suction-exhaust opening to be sucked into the lower space. In contrast, when the vibrating plate is displaced downwards, the volume of the upper space of the chamber is increased. Therefore, the pressure in the upper space is decreased. Since the upper space is connected to the outside air through the suction-exhaust opening, the pressure reduction in the upper space causes a portion of the outside air existing near the suction-exhaust opening to be sucked into the upper space. At this time, the volume of the lower space that is opposite to the upper space (the vibrating plate is disposed between the lower space and the upper space as mentioned above) is decreased, causing the pressure in the lower space to increase. The pressure increase in the lower space causes a portion of the air in the lower space to be discharged to the outside air. The vibrating plate is driven by, for example, an electromagnetic driving method. Accordingly, by reciprocating the vibrating plate, the discharging of the air in the chamber to the outside air and the sucking of the outside air into the chamber are periodically repeated. Pulsating air induced by a periodic reciprocating movement of the vibrating plate is blown against a heating element such as the radiating fin, so that the temperature boundary layer at the surface of the radiating fin is efficiently broken, as a result of which the radiating fin is cooled with high efficiency.

SUMMARY OF THE INVENTION

In a device using a vibrating plate which reciprocates, such as the devices in the aforementioned four documents, in principle, an air discharge amount can be increased by increasing the area or vibration amplitude of the vibrating plate. However, when the size (volume) of the device is limited, such as when a heating element in a small apparatus is cooled, there is a limit as to how large the area or the vibration amplitude of the vibrating plate can be made. In addition, increasing the area or the vibration amplitude of the vibrating plate increases electrical power consumption of the device.

In, for example, Japanese Unexamined Patent Application Publication No. 2-213200, a driving frequency of the vibrating plate is in a non-audible area of approximately 10 Hz. In Japanese Unexamined Patent Application Publication No. 3-116961, the air velocity in front of the radiating fin differs depending upon the frequency of the vibrating plate, with the air velocity being greater at 19 Hz than at 15 Hz (lower right column on page 3 of the specification). However, when the driving frequency is merely set at a lower non-audible area, noise is restricted, but an air discharge area per unit time is reduced in correspondence with the lower frequency.

In view of the aforementioned problems, it is desirable to provide a jet generating device which can increase heat-dissipation capability while restricting electrical power consumption as a result of optimizing a driving frequency of a vibrating member, and an electronic apparatus including the jet generating device.

According to an embodiment of the present invention, there is provided a jet generating device including a housing having an opening and containing gas therein, a vibrating member which is supported by the housing so that the vibrating member is capable of vibrating and which vibrates the gas to discharge the gas as pulsating gas through the opening, a driving mechanism for driving the vibrating member in accordance with an electrical signal, and a drive controller which generates the electrical signal at a fundamental frequency at which an input impedance of the driving mechanism is substantially a maximum and which outputs the generated electrical signal to the driving mechanism.

When the vibrating member is driven at a frequency near the fundamental frequency at which the input impedance is a substantially maximum value, heat resistance when a heating element is subjected to heat dissipation is a minimum value. In other words, the inventor has found out that, the frequency when the heat resistance is a minimum value matches the frequency at which the input impedance of the driving mechanism is substantially a maximum. The smaller the heat resistance, the higher the performance of the jet generating device. Therefore, according to the embodiment of the present invention, it is possible to provide a maximum heat-dissipation capability with minimum electrical power consumption.

A driving method of the driving unit may make use of, for example, an electromagnetic action, a piezoelectric action, or an electrostatic action.

The type of gas which may be used is not only air, but also nitrogen, helium gas, argon gas, or other types of gas.

The vibrating member may have a three-dimensional structure instead of a structure having a flat-plate form. For example, the vibrating plate may have a structure in which, for example, a side plate or a rib is mounted to the vibrating plate in order to increase rigidity. However, the vibrating member may have any form which is not limited to such a purpose. In addition, the shape of the vibrating member in a plane perpendicular to the direction of vibration of the vibrating member may be, for example, circular, elliptical, or rectangular.

In one form, the drive controller sets the fundamental frequency lower than a minimum resonance frequency of the vibrating member. For a high frequency range where a sound pressure level of the vibrating member is low (that is, a frequency range which is sufficiently higher than a minimum resonance frequency), the input impedance may become greater than the aforementioned maximum value. Accordingly, the vibrating member may be driven at such a high frequency range. In such a case, the vibration amplitude of the vibrating member becomes extremely small. This may make it impossible to obtain a predetermined gas discharge amount. In contrast, in a low frequency range near the minimum resonance frequency, even if electrical power is the same as when the vibrating member is driven at the high frequency range, the vibration amplitude can be set at its maximum value, so that, according to the embodiment of the present invention, the fundamental frequency is set near the minimum resonance frequency of the vibrating member.

In still another form, more specifically, the drive controller includes an amplifier and a signal generator, the signal generator generating a sinusoidal signal, a voltage pulse signal, or an electrical current pulse signal, each signal having a fundamental frequency at which an input impedance of the amplifier is substantially a maximum, the amplifier amplifying the generated signal and outputting the amplified signal to the driving mechanism. In this case, it is desirable that the signal generator be such that a total harmonic distortion factor of the electrical signal is less than 10%. By setting the harmonic distortion factor at a value which is less than 10%, a harmonic component providing high auditory sensation characteristics is reduced, so that the noise is at a level that does not bother human beings.

According to another embodiment of the present invention, there is provided an electronic apparatus including a heating element, a housing having an opening and containing gas therein, a vibrating member which is supported by the housing so that the vibrating member is capable of vibrating and which vibrates the gas to discharge the gas as pulsating gas towards the heating element through the opening, a driving mechanism for driving the vibrating member in accordance with an electrical signal, and a drive controller which generates the electrical signal at a frequency range including a fundamental frequency at which an input impedance of the driving mechanism is substantially a maximum and which outputs the generated electrical signal to the driving mechanism.

Examples of the electronic apparatus are a computer (which may be a laptop computer or a desktop computer when the computer is a personal computer), a Personal Digital Assistance (PDA), an electronic dictionary, a camera, a display device, an audio/visual device, a cellular phone, a game device, a car navigator system, a robot apparatus, and other electronic products.

The heating element may be an electronic part, such as an IC or a resistor, a radiating fin (heat sink), or any other element as long as it generates heat.

According the embodiments and forms of the present invention, it is possible to enhance heat-dissipation capability while restricting electrical power consumption.

DESCRIPTION OF THE PREFERRED EMBODIMENTS

Embodiments of the present invention will hereunder be described with reference to the drawings.

Figure 1:
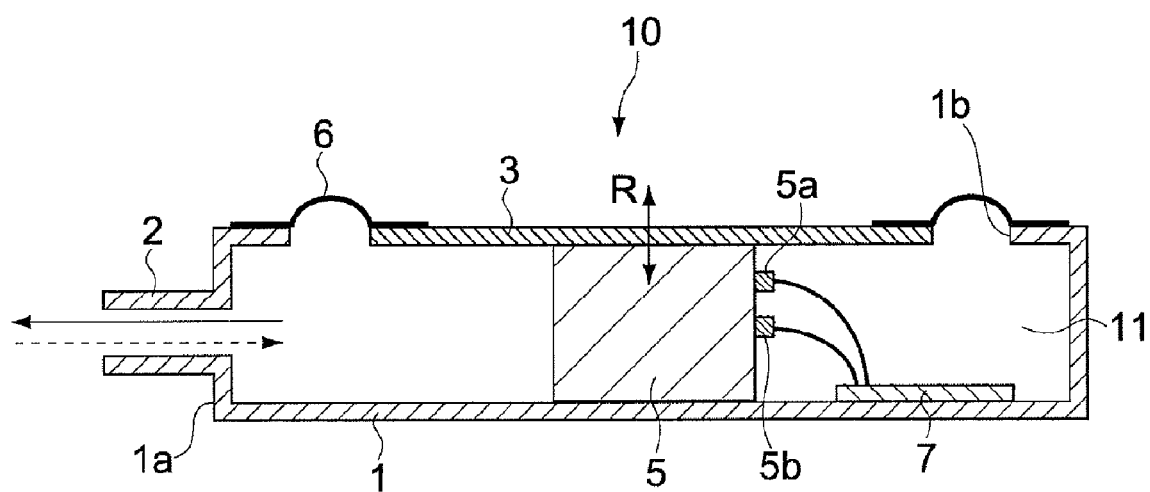
FIG. 1 is a sectional view of a jet generating device according to an embodiment of the present invention.

FIG. 1 is a sectional view of a jet generating device according to an embodiment of the present invention. A jet generating device 10 includes, for example, a housing 1 having a rectangular hole 1b in an upper portion of the housing 1. An annular resilient supporting member 6 is mounted to a periphery of the hole 1b of the housing 1, and supports a vibrating plate 3 serving as a vibrating member. A chamber 11 is formed in the housing 1 by disposing the vibrating plate 3 and the resilient supporting member 6 so as to cover the hole 1b of the housing 1. A plurality of nozzles 2 for discharging air in the chamber 11 towards a heating element (not shown), such as a radiating fin, disposed outside the housing 1 are mounted to a side surface 1a of the housing 1. The nozzles 2 may be integrated to the housing 1. Alternatively, only openings instead of the nozzles 2 may be formed in the side surface 1a.

The housing 1 has, for example, a rectangular parallelepiped shape. For example, the nozzles 2 are formed in the side surface 1a of the housing 1 so as to be arranged in the direction perpendicular to the plane of FIG. 1. The size of the housing 1 in a direction perpendicular to the plane of FIG. 1 is set, for example, in accordance with the size of the heating element, and the number of nozzles 2 can be set in accordance with the area of the side surface 1a of the housing 1. Although the resilient supporting member 6 and the vibrating plate 3 may be, for example, rectangular in accordance with the rectangular parallelepiped shape of the housing 1, they may be circular or elliptical. Although the vibrating plate 3 is illustrated as having the shape of a flat plate, it may be cone-shaped like a vibrating plate having a speaker mounted thereto.

The housing 1 is formed of, for example, resin, rubber, metal, or ceramic. Resin and rubber facilitate the formation of the housing 1 and are suited for mass-production. In addition, resin and rubber can increase a sound attenuation factor and can thus restrict noise, and can be used to reduce weight and costs. Considering heat dissipation of the housing 1, it is desirable that the metal be copper or aluminum having high thermal conductivity. The vibrating plate 3 is formed of, for example, resin, paper, rubber, or metal. The resilient supporting member 6 is formed of, for example, resin or rubber.

A driving mechanism 5 for driving the vibrating plate 3 is disposed in the chamber 11. A circuit board 7 for outputting an electrical signal to the driving mechanism 5 is electrically connected to input terminals 5a and 5b of the driving mechanism 5. The circuit board 7 may be disposed outside the circuit board 7. The driving mechanism 5 converts electrical energy of the electrical signal into mechanical energy, and is, for example, a voice coil motor making use of electromagnetic force.

Figure 2:
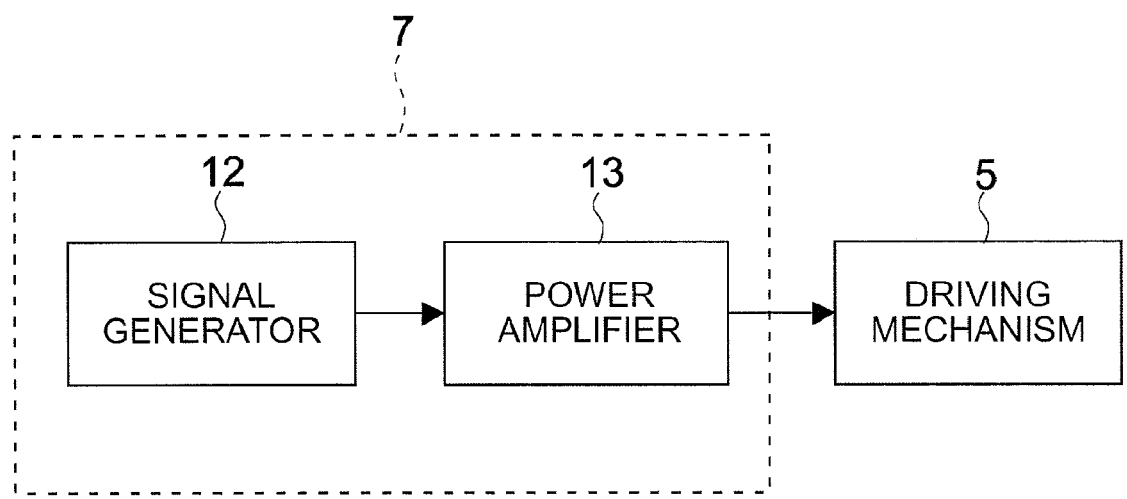
FIG. 2 is a block diagram of a structure of a circuit board.

FIG. 2 is a block diagram of a structure of the circuit board 7. The circuit board 7 includes, for example, a signal generator 12 which generates, for example, a sinusoidal electrical signal and a power amplifier 13 which amplifies electrical power of the electrical signal output from the signal generator 12. The electrical signal amplified by the power amplifier 13 is input to the driving mechanism 5.

An operation of the jet generating device 10 having the above-described structure will be described.

When, for example, a sinusoidal alternating voltage is applied to the driving mechanism 5 by the circuit board 7, the vibrating plate 3 undergoes sinusoidal vibration, causing the volume of the chamber 11 to increase or decrease. The change in the volume of the chamber 11 changes the pressure in the chamber 11, causing airflow to be produced as pulsating airflow from the nozzles 2. For example, when the vibrating plate 3 is displaced in the direction in which the volume of the chamber 11 is increased, the pressure in the chamber 11 is reduced. This causes air outside the housing 1 to flow into the chamber 11 through the nozzles 2. In contrast, when the vibrating plate 3 is displaced in the direction in which the volume of the chamber 11 is reduced, the pressure in the chamber 11 is increased. This causes air in the chamber 11 to be discharged outside the chamber 11 through the nozzles 2 and to be blown against a heating element (not shown). A reduction in air pressure around the nozzles 2 when the air is discharged from the nozzles 2 causes the air around the nozzles 2 to be sucked into the air that is discharged from the nozzles 2. That is, jets are combined. Such combined jets make it possible to cool the heating element by blowing the combined jets against the heating element.

Figure 3:
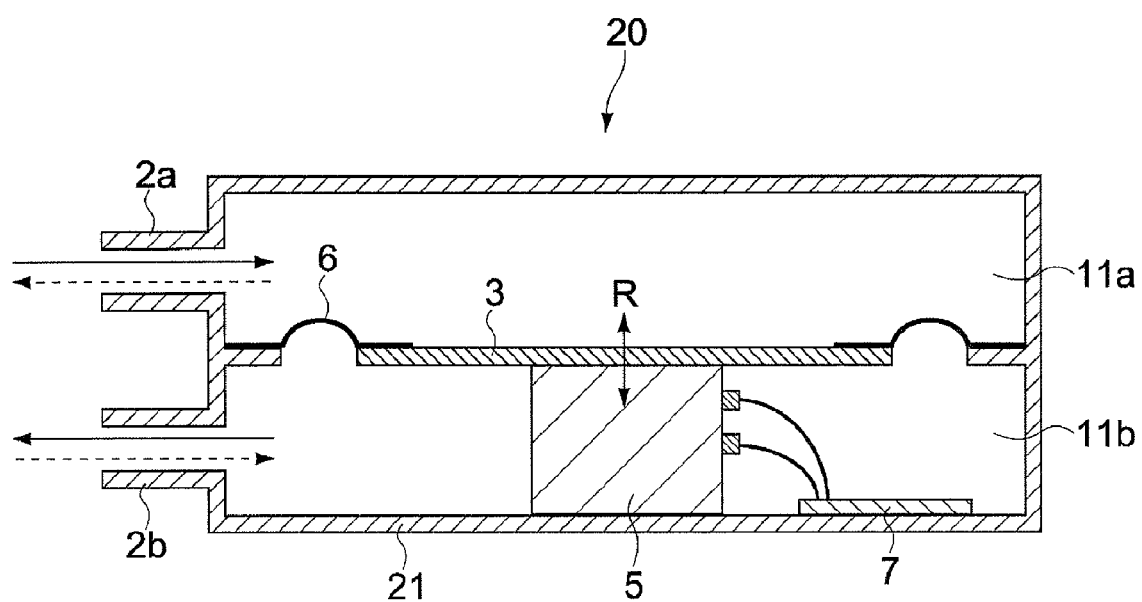
FIG. 3 is a sectional view of a jet generating device of a form having two chambers.

FIG. 3 is a sectional view of a jet generating device of a form having two chambers. In a jet generating device 20, chambers 11a and 11b are formed by a vibrating plate 3 and a resilient supporting member 6, which are disposed in a housing 21. The chamber 11a is connected to the outside of the housing 21 through a nozzle 2a. The chamber 11b is connected to the outside of the housing 21 through a nozzle 2b. In the jet generating device 20 having such a structure, vertically vibrating (in FIG. 3) the vibrating plate 3 causes the volumes of the chambers 11a and 11b to be alternately increased and decreased, so that air is alternately discharged through the nozzles 2a and 2b. When the air is discharged from the nozzles 2a and 2b, for example, sound waves are generated independently from the nozzles 2a and 2b. The sound waves are generated by vibrating the air in the housing 21 as a result of vibrating the vibrating plate 3. However, since the sound waves that are generated at the nozzles 2a and 2b have opposite phases, the sound waves weaken each other. This makes it possible to reduce noise.

In each of the jet generating device 10 shown in FIG. 1 using the vibrating plate 3 and the jet generating device 20 shown in FIG. 3 using the vibrating plate 3, when an effective area of the vibrating plate 3 is S[m$^2$], a peak-to-peak amplitude is d[m], and a vibration frequency is f[Hz], an air discharge amount per unit time Q[m$^3$/s] is expressed by the following formula:

$$Q = kSdf$$

k is a constant whose value depends upon the structure of, for example, the jet generating device 10, but k may be considered as being a certain constant value if the structures are the same. When the vibration frequency of the vibrating plate 3 is fixed, if the vibration amplitude of the vibrating plate 3 is increased, the discharge amount can be increased in proportion to the vibration amplitude. Since the discharge amount is also proportional to the frequency, the higher the driving frequency, the larger the discharge amount. However, in such a mechanical vibrating system, in general, the vibration amplitude is reduced as the vibration frequency is increased. Therefore, the discharge amount will not be increased indefinitely by increasing the frequency. In other words, there is an optimal frequency at which the discharge amount is a maximum. This frequency depends upon, for example, the size and structure of, for example, the jet generating device 10, the mass of the vibrating plate 3, the resiliency of the resilient supporting member 6, the size and shape of the openings in the nozzles 2, and a discharge-side load (such as a flow path resistance of a radiating fin).

However, the inventor has found that there is a relationship between the optimum frequency and an input impedance of the driving mechanism 5 independently of the structure of the jet generating device 10, etc. In other words, the inventor has found that, when, while maintaining at a constant value electrical energy of an alternating signal applied to the driving mechanism 5, the frequency thereof is varied, the frequency at which the air discharge amount from the jet generating device 10, etc., is a maximum, that is, heat resistance is a minimum matches the frequency at which the magnitude of the input impedance of the driving mechanism 5 is a maximum.

Figure 4:
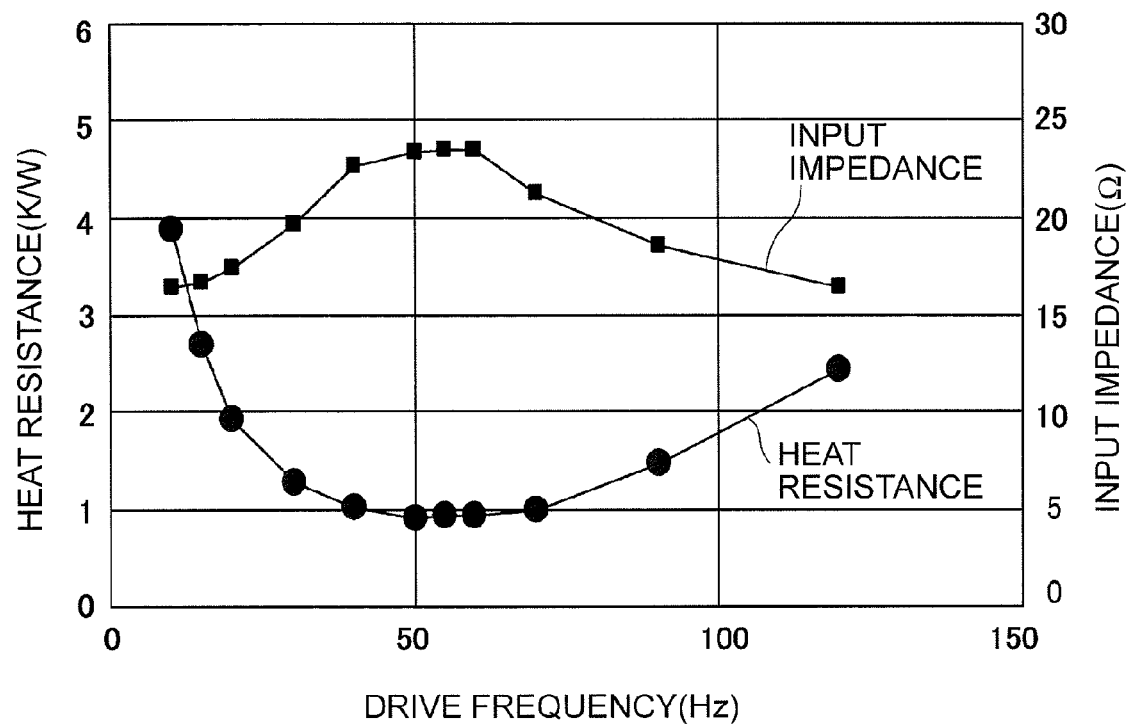
FIG. 4 is a graph showing relationships among driving frequency, heat resistance, and input impedance of a driving mechanism.

FIG. 4 is a graph showing relationships among driving frequency, heat resistance, and input impedance of the driving mechanism 5. In FIG. 4, electrical power consumed by the driving mechanism 5 is constant in, for example, a heat-dissipating system in which the jet generating device 20 shown in FIG. 3 and a suitable radiating fin (not shown) are combined. The electrical power consumption is, for example, 0.5 [W], and input frequency is varied from 10 [Hz] to 120 [Hz] while the electrical power consumption is kept constant. The vibrating plate 3 is one whose surface contributing to air vibration has a diameter of approximately 50 [mm].

As can be seen from this graph, in a frequency range of from 50 to 60 [Hz] or a frequency range of from 50 to 70 [Hz], the input impedance of the driving mechanism 5 is a maximum and the heat resistance is a minimum. In the frequency ranges of less than 20 [Hz] outside an audible frequency range, such as those indicated in Japanese Unexamined Patent Application Publication Nos. 2-213200 and 3-116961, the heat resistance becomes very high, thereby reducing heat-dissipation efficiency. Accordingly, when the driving mechanism 5 is driven at the frequency at which the input impedance of the driving mechanism 5 is a maximum, it is possible to form a heat-dissipating system having maximum heat-dissipation capability with minimum electrical power consumption. Since the input impedance of the driving mechanism 5 can be easily measured from outside the jet generating device 10 by, for example, measuring electrical current in constant voltage driving, the driving frequency can be easily adjusted to a frequency near the frequency at which the magnitude of the input impedance is a maximum.

Figure 5A:
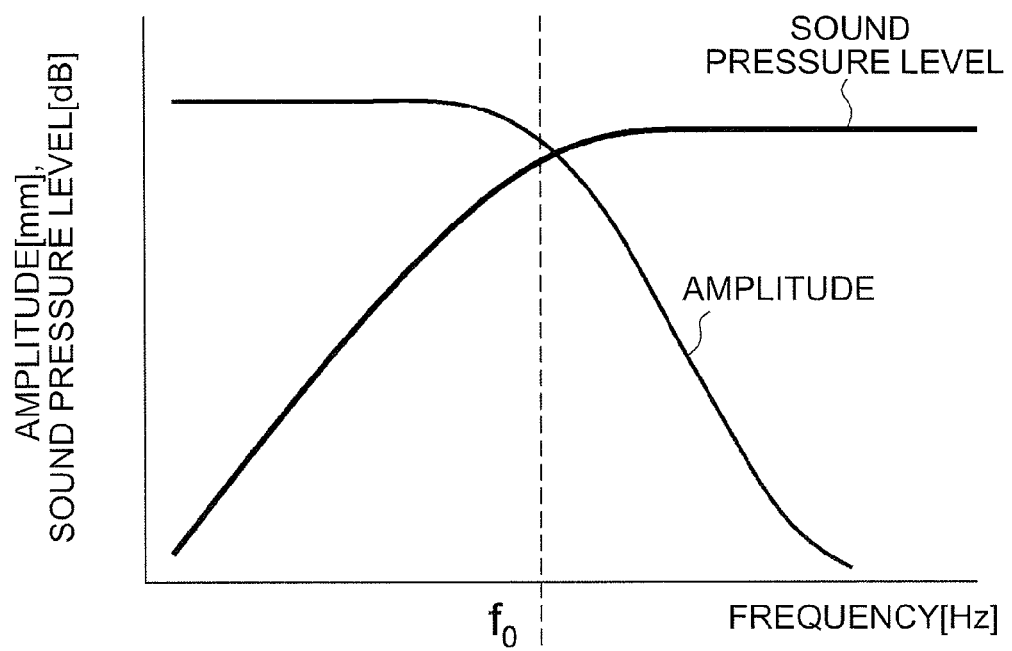
FIGS. 5A and 5B are graphs showing relationship among frequency, frequency amplitude, and sound pressure level of a vibrating plate and relationship between the frequency of the vibrating plate and the input impedance, respectively.
Figure 5B:
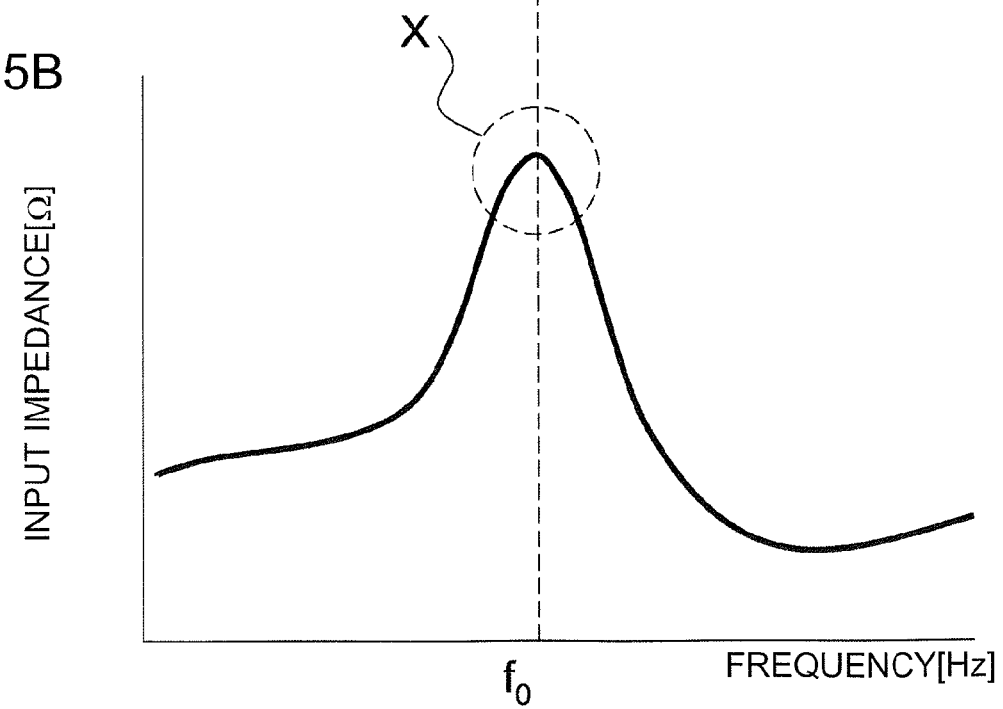

FIGS. 5A and 5B are graphs showing relationship among frequency, frequency amplitude, and sound pressure level of the vibrating plate (such as a speaker) and relationship between the frequency of the vibrating plate and the input impedance, respectively. Referring to FIG. 5A, a frequency range used by a general speaker is one which is higher than a minimum resonance frequency f0 and where the sound pressure level is substantially constant. At a frequency which is less than the minimum resonance frequency f0, since the vibration amplitude of the vibrating plate is constant regardless of the frequency, the lower the frequency, the lower the sound pressure level. In contrast, at a frequency which is higher than the minimum resonance frequency f0, since the vibration amplitude of the vibrating plate is reduced in inverse proportion to the square of the frequency, the sound pressure level is substantially flat with respect to the frequency.

With reference to FIG. 5B, a driving frequency at which the input impedance of the voice coil, which vibrates, for example, a speaker, is a maximum value X falls within a frequency range near the minimum resonance frequency f0. In, for example, the jet generating device 10 according to the embodiment, at a frequency which is less than f0, since the vibration amplitude of the vibrating plate is constant, the lower the frequency, the lower the air discharge amount. In contrast, at a frequency which is higher than f0, since the vibration amplitude is reduced in inverse proportion to the square of the frequency, the higher the frequency, the lower the air discharge amount. Therefore, performing driving at a frequency near f0 causes a maximum air discharge amount to be obtained.

As can be understood from the foregoing description, driving the driving mechanism 5 at a frequency at which the input impedance of the driving mechanism 5 is a maximum makes it possible to operate the heat-dissipating system with limited electrical consumption and maximum cooling efficiency.

Even if there are differences between individual optimal frequencies due to variations in the size and structure of the jet generating devices 10 or 20, the mass of the vibrating plate, the resiliency of the resilient supporting member 6, the size and shape of the openings in the nozzles 2, or the structure and material of, for example, a flow path resistance of a radiating fin), the driving mechanism 5 is typically driven with the optimal frequency. Therefore, it is possible to provide a heat-dissipating system allowing high yield without variations in performance.

Next, examples of, for example, specific structures of and methods used in the signal generator 12 and the power amplifier 13 of the circuit board 7 shown in FIG. 2 will be described.

The power amplifier 13 may take the form of a circuit which generates at output terminals of the power amplifier 13 voltage or electrical current which is substantially proportional to voltage applied to input terminals of the power amplifier 13. Alternatively, the power amplifier 13 may have the form of a circuit which generates at the output terminals of the power amplifier 13 voltage or electrical current which is substantially proportional to electrical current flowing between the input terminals of the power amplifier 13. In other words, the power amplifier 13 may be a linear amplifier which can supply a substantially constant voltage or electrical current regardless of the magnitude of a load (that is, the input impedance of the driving mechanism 5) connected to the output terminals of the power amplifier 13.

Although an output method of the power amplifier 13 may be a Single Ended Push Pull (SEEP) method for driving an end of the load at ground potential, it may also be a Balanced Transformerless Amplifier (BTL) method for subjecting the load to reversed-phase driving with two power amplifiers. In order to prevent vibration of the power amplifier 13, a CR series circuit or an LR parallel circuit may be additionally inserted.

Figure 6:
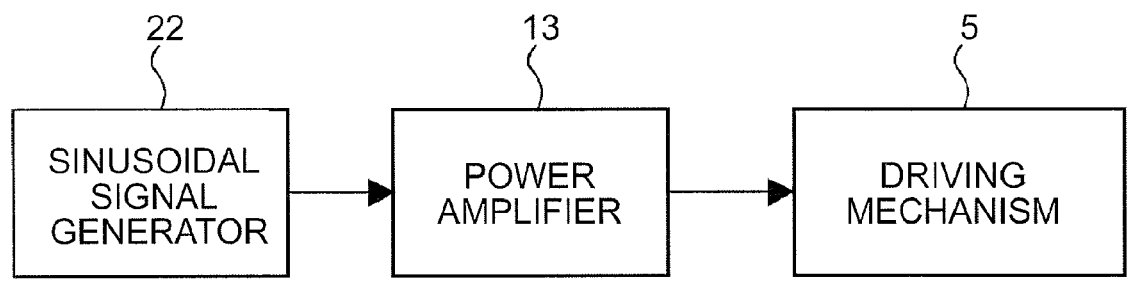
FIG. 6 is a block diagram of an example in which a sinusoidal signal generator is used as a signal generator.

In addition to using a linear amplifier as the power amplifier 13, as shown in FIG. 6, a sinusoidal signal generator 22 which generates the aforementioned sinusoidal signal may be used as the signal generator. Here, a voltage or an electrical current signal which varies sinusoidally with time is generated at output terminals of the sinusoidal signal generator 22, and a fundamental frequency of the sinusoidal signal generated by the sinusoidal signal generator 22 is set near the frequency at which the input impedance of the driving mechanism 5 is a maximum. In other words, the sinusoidal signal having a frequency near the frequency at which the input impedance of the driving mechanism 5 is a maximum is generated to drive the driving mechanism 5 while substantially maintaining the waveform of the signal.

An example of the sinusoidal signal generator 22 is, for example, a CR oscillator. The CR oscillator may be one making use of a time constant based on a capacitor and a resistor, such as a Wien bridge oscillator, a state variable oscillator, or a phase-shift oscillator, or any other type of oscillator as long as it can allow oscillation frequency to be relatively easily controlled from the outside.

When the sinusoidal signal generator 22 is a CR oscillator, it is desirable that a total harmonic distortion factor of an output signal be less than 10%. Since the output signal of the CR oscillator is input to the driving mechanism 5 through the linear power amplifier, the output signal is input to the driving mechanism 5 while substantially preserving the waveform of the oscillator. Since the displacement of the vibrating plate 3 is substantially proportional to the magnitude of an input electrical current of the driving mechanism 5, when a large amount of harmonic component is included in the input signal of the driving mechanism 5, an amount of harmonic component included in the vibration of the vibrating plate 3 is also large. When the harmonic component includes a frequency component having high audibility, noise level may become high. Therefore, a sinusoidal signal whose total harmonic distortion factor is as small as possible is typically used as the output signal of the CR oscillator. If the total harmonic distortion factor is less than 10%, the noise will not bother anyone under ordinary operation conditions. If, for example, a suitable gain control circuit is used in the CR oscillator, such a distortion factor can be relatively easily obtained.

Figure 7:
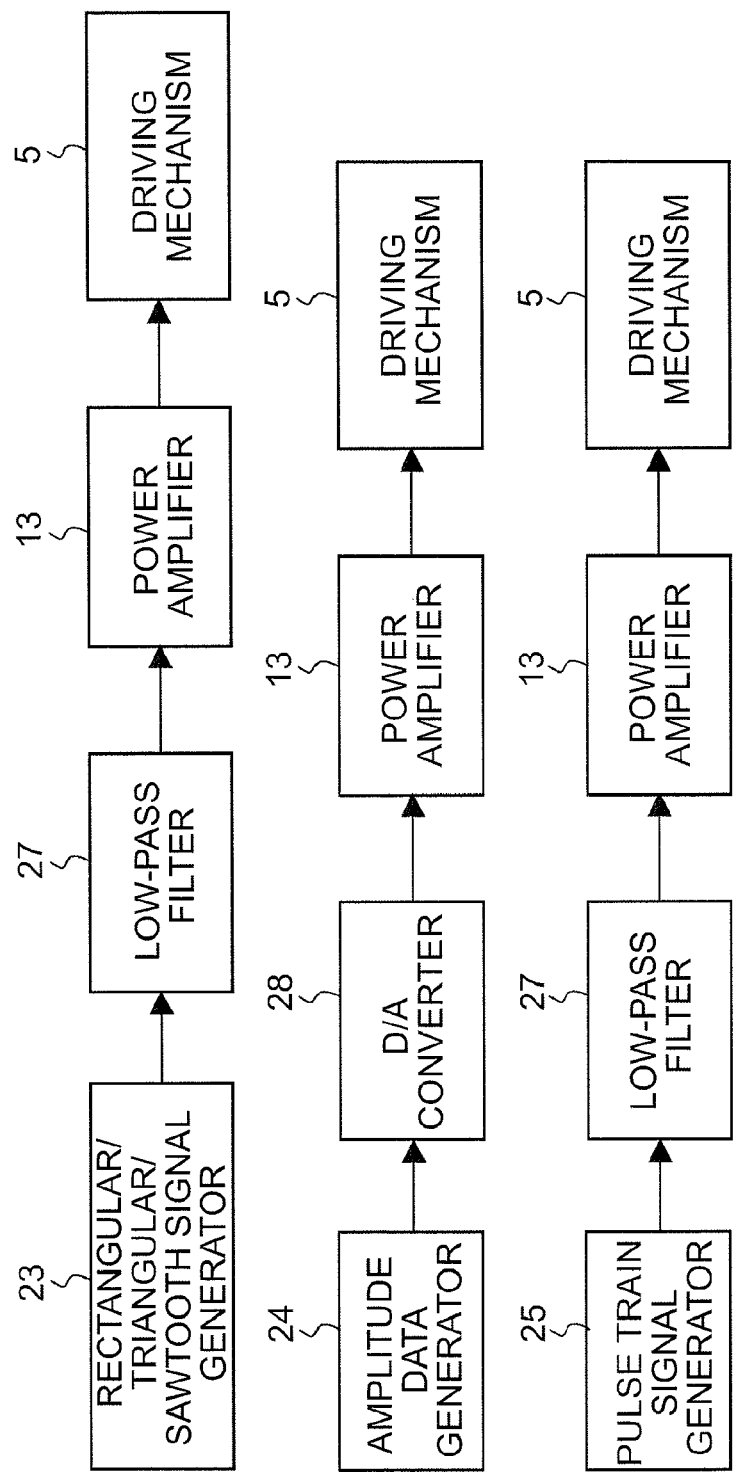
FIGS. 7A to 7C are block diagrams of specific examples of the sinusoidal signal generator shown in FIG. 6.

In FIG. 7A, a signal generator 23 which generates a rectangular, a triangular, or a sawtooth signal is used as the sinusoidal signal generator 22. An output signal of the rectangular/triangular/sawtooth signal generator 23 is passed through a low-pass filter 27 for reducing a harmonic component, thereby making it possible to produce a low-distortion sinusoidal signal whose harmonic component is low. The rectangular/triangular/sawtooth signal generator 23 may use a circuit type which is generally known with regard to the above-described CR oscillator.

It is desirable that the low-pass filter 27 attenuate the amplitude of the harmonic wave to less than $\frac{1}{10}$ of the original amplitude. It is further desirable that an active filter or a switch capacitor filter having excellent attenuation characteristics be used in the low-pass filter 27. The order and characteristics (Bessel type, Butterworth type, Chebyshev type, etc.) are properly selected in accordance with a typical output distortion factor.

The sinusoidal signal generator may use a digital circuit instead of an analog circuit including a CR type. For example, as shown in FIG. 7B, an amplitude data generator 24 which generates a signal whose sinusoidal wave amplitude is digitized and a digital-to-analog (D/A) converter 28 which converts the amplitude data to the magnitude of a voltage or electrical current are used. By changing a reference clock frequency of the amplitude data generator 24, it is possible to control the frequency of the sinusoidal signal output from the D/A converter 28.

The amplitude data generator 24 may make use of a solid-state memory which previously stores amplitude data or may have a structure which generates sinusoidal function data by digital computation. The number of bits and samplings of the digital data may be properly selected in accordance with a typical distortion factor. The digitally generated sinusoidal signal includes quantum noise produced by sampling frequency. In order to reduce the quantum noise, a low-pass filter which is an analog or a digital circuit may be inserted between the D/A converter 28 and the power amplifier 13.

As shown in FIG. 7C, a pulse train signal generator 25 may be used as the digital sinusoidal signal generator. The sinusoidal signal generator 22 includes the pulse train signal generator 25 and a low-pass filter 27, the pulse train signal generator 25 generating a voltage pulse train whose voltage changes continually with time or an electrical current pulse train whose electrical current changes continually with time. In a sinusoidal signal generator using a D/A converter, an output waveform of the D/A converter changes similarly to the waveform of a signal input to the driving mechanism 5, whereas signals generated by the pulse train signal generator 25 are such that a voltage or an electrical current pulse duration time changes with their amplitudes being substantially constant. Passing such signals through the low-pass filter 27 attenuates a harmonic component of the pulse train, so that the signals are shaped to have a continuous waveform. Adjusting the width and period of the pulse train makes it possible to output a sinusoidal signal to an output of the low-pass filter 27. Changing a reference clock frequency applied to the pulse train signal generator 25 makes it possible to control the frequency of the sinusoidal signal.

The pulse train generated at the pulse train signal generator 25 that is output may be a pulse train whose pulse interval changes with a constant pulse width or a pulse train which is subjected to pulse width modulation so as to have a pulse width that changes with a period being constant. For either pulse train, properly controlling the ratio between the pulse width and the period with every sampling period makes it possible to output a sinusoidal signal to the output of the low-pass filter 27. Although the pulse train generated at the pulse train signal generator 25 may have a constant amplitude (voltage or electrical current), it may be a signal which changes with time.

The power amplifiers 13 described with reference to FIGS. 7A to 7C are linear amplifiers which can each supply a substantially constant voltage or electrical current regardless of the magnitude of a load (that is, the input impedance of the driving mechanism 5) connected to the output terminals. However, as shown in FIG. 8, the power amplifier 13 may be a non-linear amplifier or may be formed as a switching circuit 29.

When the switching circuit 29 is used, the above-described pulse train signal generator 25 may be used as the signal generator. That is, a fundamental frequency of a pulse train generated by the pulse train signal generator 25 is set at a frequency which is near the frequency at which the input impedance of the driving mechanism 5 is a maximum. The switching circuit 29, which serves as the amplifier, generates at its output terminals a voltage pulse or an electrical current pulse in synchronism with an input signal. The low-pass filter 27 may be omitted when quantum noise included in a pulse train signal is small.

Figure 8:
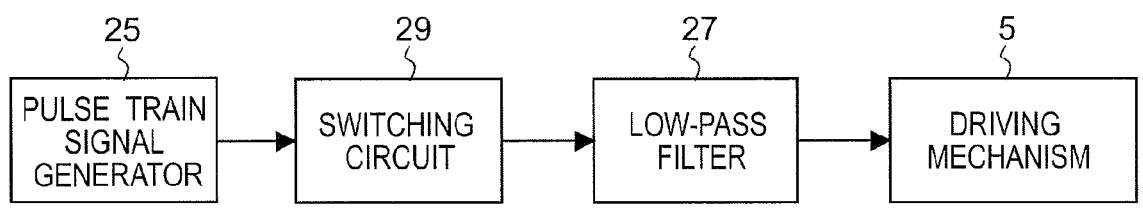
FIG. 8 is a block diagram of an example in which a switching circuit is used as a power amplifier.
Figure 9:
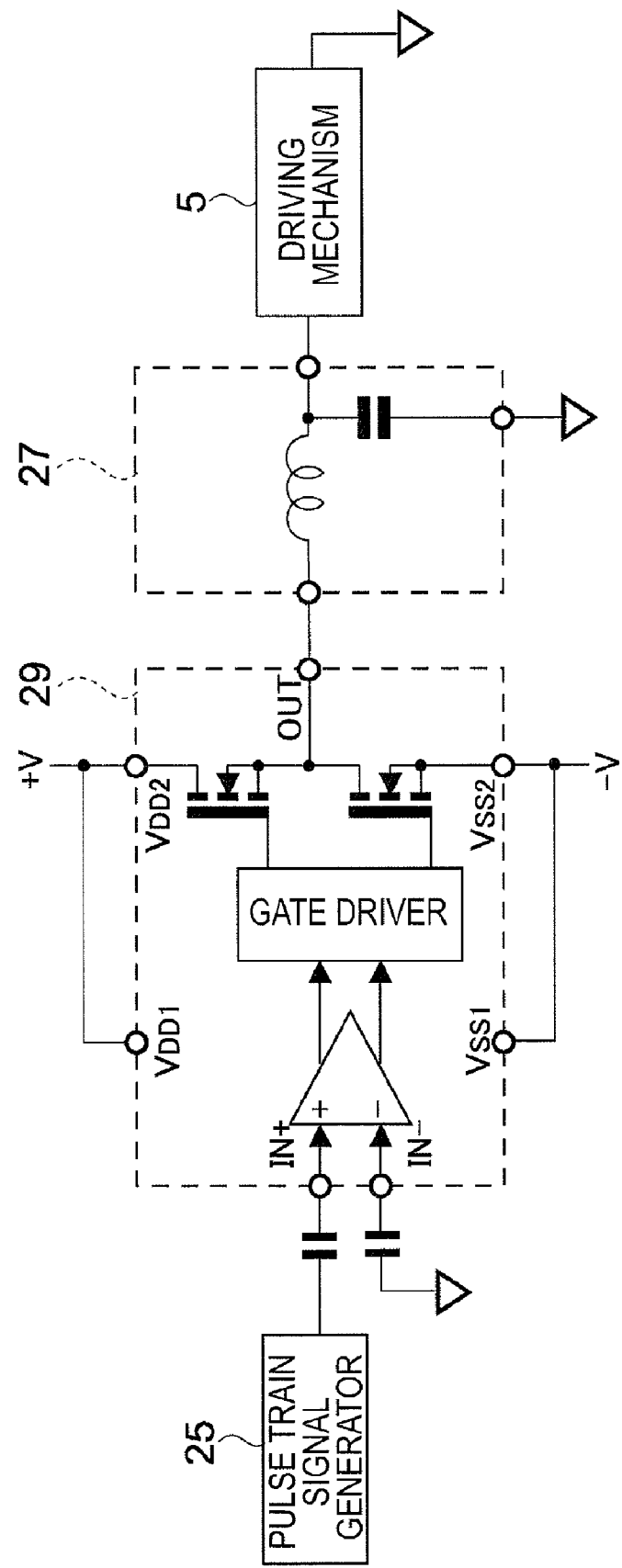
FIG. 9 shows an exemplary structure of the switching circuit shown in FIG. 8.

FIG. 9 shows an exemplary structure of the switching circuit 29 shown in FIG. 8. The structure is an example in which one of the input terminals of the driving mechanism 5 is driven at ground potential. When a pulse train signal from the pulse train signal generator 25 is input to a differential amplifier for the switching circuit 29, the signal is converted into a digital signal in synchronism with a timing thereof. A non-inverting output and an inverting output of the differential amplifier are input to a gate driver to generate a typical timing signal for turning on or off switching elements (MOS- FETs). For example, when a pulse signal is input to the differential amplifier, one of the switching elements turns on and the other of the switching elements turns off. In contrast, when a pulse signal is not input to the differential amplifier, the one of the switching elements is turned off, and the other of the switching elements is turned on. This causes a signal in synchronism with the pulse train signal from the pulse train signal generator 25 to be output to an output of the switching circuit 29. Since a large amount of harmonic component is included in this signal, the harmonic component is attenuated by, for example, a low-pass filter 27 including an inductor and a capacitor. This makes it possible to apply a sinusoidal signal to the input terminals of the driving mechanism 5.

Figure 10:
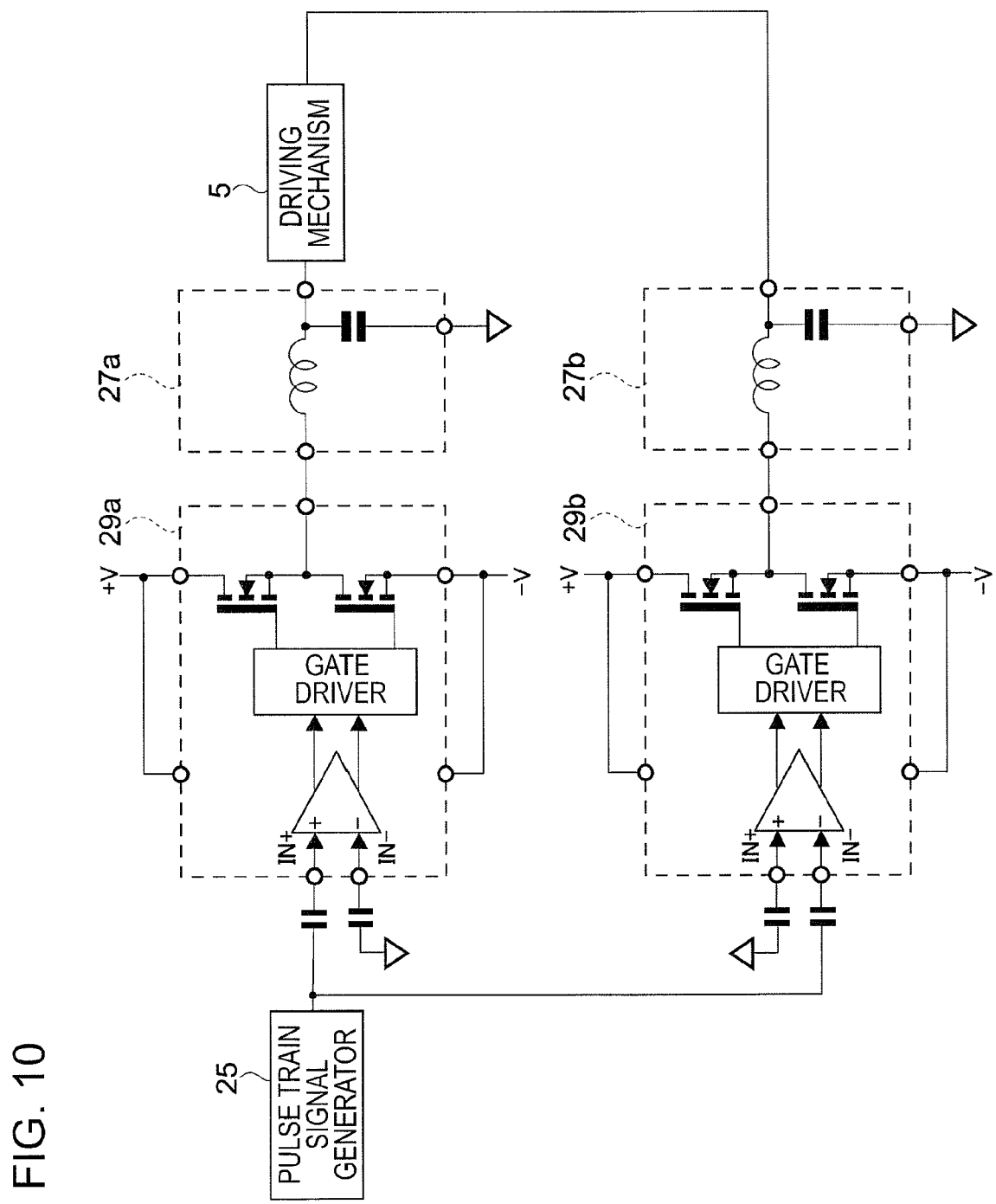
FIG. 10 shows a different exemplary structure of the switching circuit shown in FIG. 8.

FIG. 10 shows an example in which an output of the pulse train signal generator 25 is input to two switching circuits 29*a* and 29*b*. The two switching circuits 29*a* and 29*b* have structures that are similar to the structure of the switching circuit 29 shown in FIG. 9. Low-pass filters 27*a* and 27*b* are connected to outputs of the respective switching circuits 29*a* and 29*b*. Such a structure makes it possible to double the vibration amplitude with supply voltages (+V and −V) that are the same as those shown in FIG. 9.

It should be understood by those skilled in the art that various modifications, combinations, sub-combinations and alterations may occur depending on design requirements and other factors insofar as they are within the scope of the appended claims or the equivalents thereof.

What is claimed is:

1. A jet generating device comprising:
   a housing having a plurality of openings that each provide for the inlet and outlet of gas into the housing, the housing containing the gas therein;
   a vibrating member supported by the housing so that the vibrating member vibrates to alternately discharge the gas as pulsating gas through the plurality of openings and generate sound waves having opposite phases at the plurality of openings;
   a driving mechanism which drives the vibrating member in accordance with an electrical signal; and
   a drive controller which generates the electrical signal at a fundamental frequency at which an input impedance of the driving mechanism is substantially a maximum and which outputs the generated electrical signal to the driving mechanism,
   wherein,
   the plurality of openings are adjacent to each other such that the pulsating gas alternately discharges through the plurality of openings along paths parallel to each other thereby causing sound waves generated at the plurality of openings and having opposite phases to weaken each other.

2. The jet generating device according to claim 1, wherein the drive controller sets the fundamental frequency lower than a minimum resonance frequency of the vibrating member.

3. The jet generating device according to claim 1, wherein the drive controller includes an amplifier and a signal generator, the signal generator generating a sinusoidal signal, a voltage pulse signal, or an electrical current pulse signal, each signal having a fundamental frequency at which an input impedance of the amplifier is substantially a maximum, the amplifier amplifying the generated signal and outputting the amplified signal to the driving mechanism.

4. The jet generating device according to claim 3, wherein the signal generator is such that a total harmonic distortion factor of the electrical signal is less than 10%.

5. The jet generating device according to claim 1, wherein
   the paths parallel to each other include a first path and a second path, and
   the first opening discharges gas along the first path that causes the gas to blow against the heating element while the second opening simultaneously receives gas from the second path.

6. An electronic apparatus comprising:
   a heating element;
   a housing containing gas therein, the housing having a first opening and a second opening that each provide for the inlet and outlet of the gas into the housing
   a vibrating member supported by the housing so that the vibrating member vibrates to alternately discharge the gas as pulsating gas towards the heating element through the first opening and the second opening and generate sound waves having opposite phases at the first opening and the second opening;
   a driving mechanism which drives the vibrating member in accordance with an electrical signal; and
   a drive controller which generates the electrical signal at a frequency range including a fundamental frequency at which an input impedance of the driving mechanism is substantially a maximum and which outputs the generated electrical signal to the driving mechanism,
   wherein,
   the plurality of openings are adjacent to each other such that the pulsating gas alternately discharges through the plurality of openings along paths parallel to each other thereby causing sound waves generated at the plurality of openings and having opposite phases to weaken each other.

7. The electronic apparatus according to claim 6, wherein
   the paths parallel to each other include a first path and a second path, and
   the first opening discharges gas along the first path that causes the gas to blow against the heating element while the second opening simultaneously receives gas from the second path.

* * * * *